(12) United States Patent
Fujie et al.

(10) Patent No.: US 9,793,846 B2
(45) Date of Patent: Oct. 17, 2017

(54) POWER CONVERSION DEVICE

(71) Applicant: Mitsubishi Electric Corporation, Tokyo (JP)

(72) Inventors: Kenichi Fujie, Tokyo (JP); Katsuya Tsujimoto, Tokyo (JP); Takamasa Asai, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/124,834

(22) PCT Filed: Jun. 30, 2014

(86) PCT No.: PCT/JP2014/067398
§ 371 (c)(1),
(2) Date: Sep. 9, 2016

(87) PCT Pub. No.: WO2016/001976
PCT Pub. Date: Jan. 7, 2016

(65) Prior Publication Data
US 2017/0019051 A1    Jan. 19, 2017

(51) Int. Cl.
*H02P 6/06* (2006.01)
*H02P 27/00* (2006.01)
(Continued)

(52) U.S. Cl.
CPC ............... *H02P 27/00* (2013.01); *H02J 1/00* (2013.01); *H02M 1/32* (2013.01); *H02M 1/36* (2013.01);
(Continued)

(58) Field of Classification Search
CPC .................................. H02P 6/182; H02P 7/00
(Continued)

(56) References Cited

U.S. PATENT DOCUMENTS

2003/0169606 A1* 9/2003 Miermans ............... H02M 1/36
363/49
2005/0242787 A1* 11/2005 Shirokoshi .......... H02M 3/1588
323/222

(Continued)

FOREIGN PATENT DOCUMENTS

JP   2007-185027 A   7/2007
JP      4412141 B2   2/2010

OTHER PUBLICATIONS

International Search Report for PCT/JP2014/067398 dated Jul. 22, 2014.

*Primary Examiner* — Erick Glass
(74) *Attorney, Agent, or Firm* — Sughrue Mion, PLLC; Richard C. Turner

(57) ABSTRACT

A power conversion device has an internal power supply switch and a bias power supply switch connected in parallel with the internal power supply switch, wherein, when an output voltage of an internal power supply circuit is greater than a predetermined value when a power supply is started up, the bias power supply switch opens a current path, and when the power supply is stopped, the step-up power supply circuit is stopped based on a stop signal output by the internal power supply circuit and the internal power supply switch closes the current path, and when the output voltage of the internal power supply circuit becomes lower than a predetermined value, the bias power supply switch closes the current path.

7 Claims, 8 Drawing Sheets

(51) Int. Cl.
*H02J 1/00* (2006.01)
*H02M 1/36* (2007.01)
*H02M 3/07* (2006.01)
*H02P 6/20* (2016.01)
*H02M 1/32* (2007.01)
*H02M 7/5387* (2007.01)
*H02P 27/06* (2006.01)
*H02M 1/00* (2006.01)

(52) U.S. Cl.
CPC ........... *H02M 3/07* (2013.01); *H02M 7/5387* (2013.01); *H02P 6/20* (2013.01); *H02P 27/06* (2013.01); *H02M 2001/0006* (2013.01); *H02P 2201/09* (2013.01)

(58) Field of Classification Search
USPC .................................................. 318/400.06
See application file for complete search history.

(56) References Cited

U.S. PATENT DOCUMENTS

2010/0060251 A1\* 3/2010 Hane ..................... H02M 3/156
 323/282
2010/0301824 A1\* 12/2010 Yamamoto ............ H02M 3/156
 323/283

\* cited by examiner

POWER CONVERSION DEVICE

CROSS REFERENCE TO RELATED APPLICATIONS

This application is a National Stage of International Application No. PCT/JP2014/067398 filed Jun. 30, 2014, the contents of all of which are incorporated herein by reference in their entirety.

TECHNICAL FIELD

The present invention relates to a power conversion device, provided between a direct current power source and a multi-phase rotating electrical machine, that converts direct current to alternating current and converts the alternating current to direct current, and in particular, relates to a power conversion device having an internal power supply switch for preventing malfunction when the power supply is started up or stopped.

BACKGROUND ART

A large number of electronic control devices are mounted in a vehicle, and are configured so as to carry out a predetermined operation in accordance with power supplied from a power source. There are cases in which direct current power from a chargeable and dischargeable direct current power supply is used as the power source, and cases in which direct current power obtained by rectifying alternating current power from a multi-phase rotating electrical machine is used.

Voltage of the power source fluctuates transiently when a multi-phase rotating electrical machine is started up or stopped. This transient voltage fluctuation may cause a malfunction of an electronic control device that is operating in accordance with a minute electrical signal.

Because of this, a power supply switch is provided between an anode terminal of a direct current power supply and a power supply device, and when a voltage drop of the direct current power supply is detected in a power supply start-up transitional period, operation of the power supply device is stopped by the power supply switch being deactivated, thereby preventing a malfunction of an electronic control device, which is a load at a subsequent stage (Patent Document 1).

However, a power conversion device wherein power is supplied from a direct current power supply to a multi-phase rotating electrical machine, or induction voltage from a multi-phase rotating electrical machine is rectified and supplied to a direct current power supply, is such that no insulation element is provided between a power conversion unit that handles a large current and a control unit that handles a minute electrical signal in a system wherein voltage of a direct current power supply acting as a power source is low, that is, the kind of system that has a lead battery as a power source, because of which there is concern that a minute signal circuit of the control unit will be destroyed by a sneak current flowing from the power conversion unit to the control unit when a power source start-up or stopping sequence is poor, and concern that a flow-through current will occur due to a malfunction of a power semiconductor switching element of the power conversion unit.

Also, a kind of small power conversion device mounted in a power conversion device integrated rotating machine device, wherein a power conversion unit and a multi-phase rotating electrical machine are an integrated structure, is such that a current sensor, smoothing capacitor, or the like, is omitted because of size restrictions, and a circuit that compares and calculates anode voltage or cathode voltage of a direct current power supply and phase voltage of the multi-phase rotating electrical machine is provided so that a failure of the power conversion unit can be detected even without the sensors (Patent Document 2).

CITATION LIST

Patent Literature

[Patent Document 1] JP-B-4,412,141
[Patent Document 2] JP-A-2007-185027

SUMMARY OF INVENTION

Technical Problem

Consequently, a power conversion device, provided between a direct current power source and a multi-phase rotating electrical machine, that converts direct current to alternating current and converts the alternating current to direct current is such that, when a power supply switch is provided between a direct current power supply and a failure detection unit with the object of preventing malfunction when the power supply is started up or stopped, there is concern that a voltage detection error will occur due to a voltage drop or response delay caused by the power supply switch, causing a reduction in the failure detection accuracy of the failure detection unit.

The invention, having been contrived in order to resolve such a problem, has an object of providing a power conversion device including an internal power supply switch such that dark current when an operation stops is reduced, malfunction when a power supply is started up or stopped is prevented, and an error in voltage input into a failure detection unit is low.

Solution to Problem

The invention is a power conversion device, including a power conversion unit that converts direct current power into alternating current power between a direct current power supply and a multi-phase rotating electrical machine, a control unit that controls an operation of the power conversion unit, a step-up power supply circuit connected to the power conversion unit and supplying an operation power supply to the power conversion unit, an internal power supply circuit, connected to an anode terminal of the direct current power supply via an external power supply switch, that outputs a predetermined voltage based on a state of the external power supply switch and outputs a step-up power supply circuit start-up signal to the step-up power supply circuit, an internal power supply switch, connected between the direct current power supply and the step-up power supply circuit, that opens or closes a current path from the direct current power supply to the step-up power supply circuit based on an output voltage of the step-up power supply circuit, and a bias power supply switch, connected in parallel with the internal power supply switch, that opens or closes a current path from the direct current power supply to the step-up power supply circuit based on an output voltage of the internal power supply circuit, wherein, when the output voltage of the internal power supply circuit is equal to or greater than a predetermined value at a time of a start-up by the external power supply switch, the bias power supply switch opens a current path, the step-up power supply circuit steps up and outputs a predetermined voltage based on the step-up power supply circuit start-up signal, and the internal power supply switch opens a current path, when the output voltage of the internal power supply circuit is equal to or lower than a predetermined value at a time of a stop by the external power supply switch, the step-up operation of the step-up power supply circuit is stopped in response to a stopping of the step-up power supply circuit start-up signal and the internal power supply switch closes the current path, and when the output voltage of the internal power supply circuit becomes lower than a predetermined value, the bias power supply switch closes the current path.

Also, the invention is a power conversion device wherein an internal power supply switch is configured of an n-channel MOSFET wherein, when the output voltage of the internal power supply circuit is equal to or greater than a predetermined value when a power supply is started up, the bias power supply switch opens a current path, the step-up power supply circuit steps up and outputs a predetermined voltage based on the step-up power supply circuit start-up signal, and the internal power supply switch opens a current path, the step-up operation of the step-up power supply circuit is stopped in response to a stopping of the step-up power supply circuit start-up signal and the internal power supply switch closes the current path when the power supply is stopped, and when the output voltage of the internal power supply circuit becomes lower than a predetermined value, the bias power supply switch closes the current path.

Advantageous Effects of Invention

The invention is a power conversion device such that alternating current power is supplied to a multi-phase rotating electrical machine via a power conversion unit connected to a chargeable and dischargeable direct current power supply, or direct current power is supplied to the direct current power supply from a multi-phase rotating electrical machine, wherein dark current flowing when an operation is stopped is reduced, malfunction when the power supply is started up or stopped is prevented, and furthermore, voltage error input into a failure detection unit can be reduced.

The foregoing and other objects, features, aspects and advantages of the present invention will become more apparent from the following detailed description of the present invention when taken in conjunction with the accompanying drawings.

DESCRIPTION OF EMBODIMENTS

Figure 1:
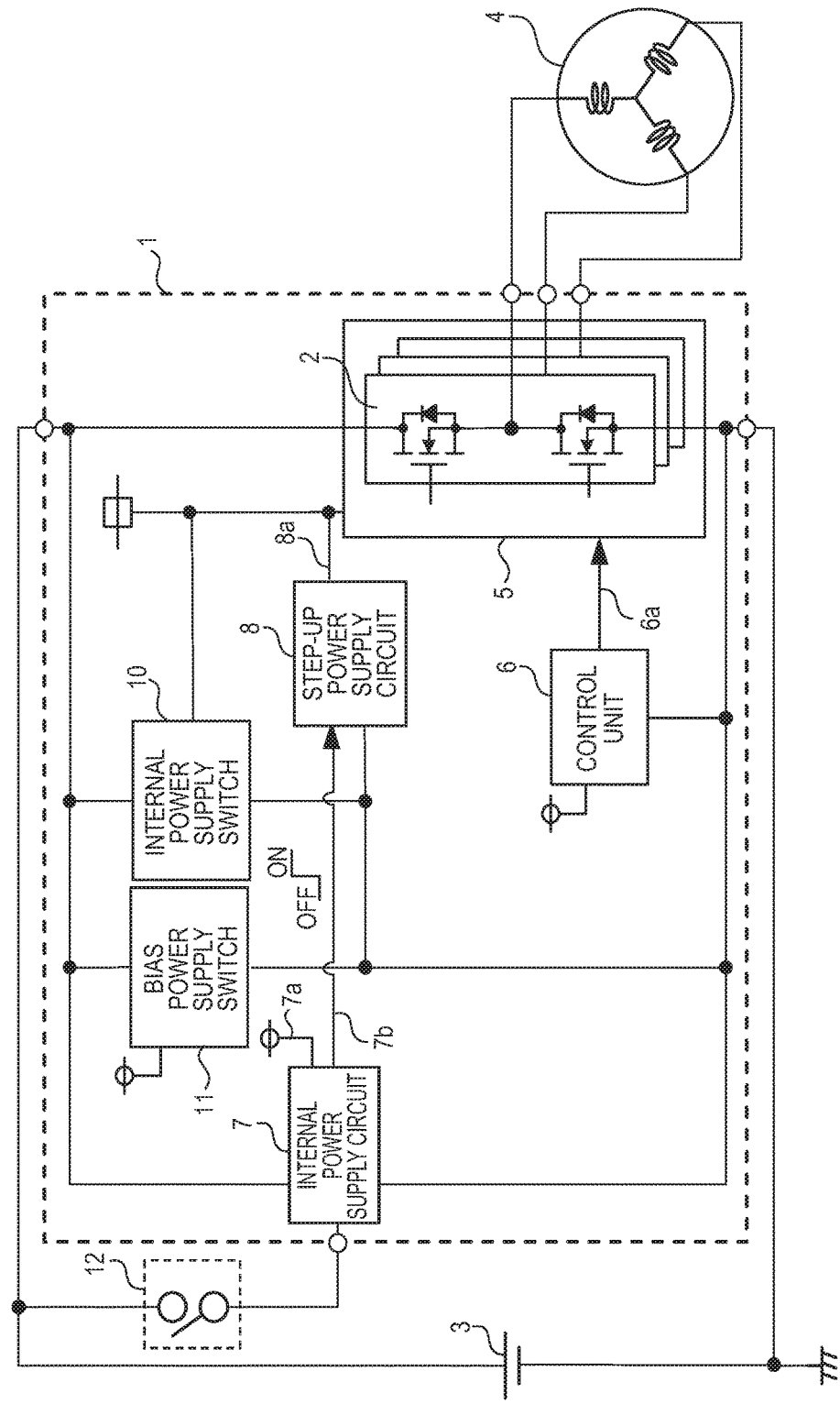
FIG. 1 is a block diagram showing a configuration of a power conversion device according to a first embodiment of the invention.

Hereafter, based on the drawings, a detailed description will be given of embodiments of the invention. Identical numbers in the drawings indicate identical configurations.

First Embodiment

FIG. 1 shows a configuration of a power conversion device in a first embodiment of the invention. As shown in FIG. 1, a power conversion device 1 is such that a predetermined number (three in FIG. 1) of phased bridge circuits, wherein upper and lower arms are configured by two power semiconductor switching elements 2 being connected in series, are connected in parallel, both ends (one pair of ends) of the phased bridge circuits are connected to a chargeable and dischargeable direct current power supply 3, each connection point of the serial connections of the power semiconductor switching elements 2 configuring the phased bridge circuits is connected to a motor winding alternating current terminal of a phase of a multi-phase rotating electrical machine 4, and the power conversion device carries out alternating current-direct current power conversion or direct current-alternating current power conversion between the multi-phase rotating electrical machine 4 and direct current power supply 3.

The power conversion device 1 includes a power conversion unit 5 having the power semiconductor switching element 2, a control unit 6, an internal power supply circuit 7, a step-up power supply circuit 8, an internal power supply switch 10, and a bias power supply switch 11.

The control unit 6 acquires information on an external environment, such as an anode voltage of the direct current power supply 3 or a rotation speed of the multi-phase rotating electrical machine 4, using various sensors (not shown) or communication, calculates an on-state time of the power semiconductor switching element 2 configuring the power conversion unit 5, and outputs a gate drive signal 6a to the power conversion unit 5.

The internal power supply circuit 7 detects an on-state or off-state of an external power supply switch 12, and when the external power supply switch 12 is in an activated state, the internal power supply circuit 7 outputs a predetermined voltage from an output terminal 7a, and outputs a step-up power supply circuit start-up signal 7b.

The step-up power supply circuit 8 acquires the step-up power supply circuit start-up signal 7b, steps up the voltage with the anode voltage of the direct current power supply 3 as a reference when the step-up power supply circuit start-up signal 7b is activated, and outputs a predetermined voltage from an output terminal 8a.

The internal power supply switch 10 is connected between an anode terminal of the direct current power supply 3 and the step-up power supply circuit 8, and opens or closes a current path based on the output voltage of the step-up power supply circuit 8.

The bias power supply switch 11 is connected in parallel with the internal power supply switch 10, and opens or closes a current path from the anode terminal of the direct current power supply 3 to the step-up power supply circuit 8 based on the output voltage of the internal power supply circuit 7.

In FIG. 1, the power semiconductor switching element 2 of the power conversion unit 5 is configured of, for example, a MOSFET or IGBT. Furthermore, the power conversion unit 5 is configured of, for example, a turn-off surge voltage control circuit wherein a push-pull type pre-driver and a diode, resistor, resistor switch, or the like, are combined.

Also, the direct current power supply 3 is commonly used as, for example, a vehicle power supply. The direct current power supply 3 is configured of a lead storage battery, a lithium ion battery, an electric double layer capacitor, or the like. The control unit 6 is configured of, for example, a logic circuit such as a microcomputer or ASIC.

The internal power supply circuit 7 is configured of, for example, a DC-DC converter or series regulator. Also, as the internal power supply circuit 7 detects an on-state or off-state of the external power supply switch, the internal power supply circuit 7 includes a voltage detection circuit in which, for example, a transistor or comparator is used. Furthermore, the internal power supply circuit 7 outputs the step-up power supply circuit start-up signal 7b when a predetermined time elapses after outputting a predetermined voltage, because of which, for example, a timer circuit that utilizes a time constant of a first delay circuit configured of a resistor and a capacitor, or a counter circuit that utilizes an oscillator and a semiconductor element, is provided.

The step-up power supply circuit 8 is configured of, for example, a DC-DC converter or a charge pump circuit.

The internal power supply switch 10 is configured of, for example, an n-channel MOSFET. The bias power supply switch 11 is configured of, for example, a transistor or a p-channel MOSFET. Also, a comparator may be included with an object of detecting the output voltage of the internal power supply circuit.

Hereafter, using a timing chart of FIG. 2, a description will be given of operations when the power conversion device 1 power supply is started up and stopped.

When the power conversion device 1 power supply is started up, firstly, the external power supply switch 12 is activated at a time T1, and when that information is detected in the internal power supply circuit 7, the internal power supply circuit 7 starts a voltage output, and the output voltage of the internal power supply circuit 7 reaches a voltage V1 at a time T2. Herein, the voltage V1 is a voltage value such that creates a state wherein a power supply start-up transitional period of the control unit 6 is exceeded and no malfunction occurs, and a method whereby, for example, the voltage V1 is in the region of 60% to 70% of a predetermined output voltage of the internal power supply circuit 7 may be proposed. Alternatively, it is desirable that, for example, a value in the region of 1.4 times to 1.7 times a voltage at which the control unit 6 does not malfunction is set as the predetermined output voltage value of the internal power supply circuit 7.

Also, when the output voltage of the internal power supply circuit 7 reaches a voltage V2 at a time T3, the bias voltage switch 11 is activated, and the anode voltage of the direct current power supply 3 is applied to the step-up power supply circuit 8.

Furthermore, the internal power supply circuit 7 outputs (activates) the step-up power supply circuit start-up signal 7b at a time T4 after the elapse of a predetermined time Ton from the output voltage of the internal power supply circuit 7 reaching a predetermined value (T3a), the step-up power supply circuit start-up signal 7b is received in the step-up power supply circuit 8, and a step-up operation is started. Herein, as a method of setting the predetermined time Ton, for example, a method whereby the predetermined time Ton is the time from the output voltage of the internal power supply circuit reaching the voltage V2 until the bias power supply switch 11 is activated and the anode voltage of the direct current power supply 3 applied to the interior of the power conversion device 1 stabilizes, or a method whereby the predetermined time Ton is the time needed for initialization of the microcomputer configuring the control unit 6, may be proposed.

When the output voltage of the step-up power supply circuit reaches a voltage V3 at a time T5, the internal power supply switch 10 is activated, whereby the start-up of the power conversion device 1 is completed.

When the power conversion device 1 power supply is stopped, firstly, the external power supply switch 12 is deactivated at a time T6, that information is detected in the internal power supply circuit 7 and output of the step-up power supply circuit start-up signal 7b stopped (deactivated), and the step-up operation is stopped in the step-up power supply circuit 8 in response to the stopping (deactivating) of the output of the step-up power supply circuit start-up signal 7b. Then, when the output voltage of the step-up power supply circuit 8 becomes less than the voltage V3 at a time T7, the internal power supply switch 10 is deactivated.

Also, the internal power supply circuit 7 causes voltage output to stop at a time T8 after the elapse of a predetermined time Toff from the external power supply switch 12 being deactivated. Herein, as a method of setting the predetermined time Toff, for example, a method whereby the predetermined time Toff is the time until the output voltage of the step-up power supply circuit 8 drops as far as the anode voltage of the direct current power supply 3, or a method whereby the predetermined time Toff is the time needed for a process of stopping the power supply to the microcomputer configuring the control unit 6, may be proposed.

Then, when the output voltage of the internal power supply circuit 7 becomes less than the voltage V2 at a time T9, the bias power supply switch 11 is deactivated, and the current path from the anode terminal of the direct current power supply 3 to the interior of the power conversion device 1 is closed.

Thus far is the power supply stopping process, and furthermore, when the output voltage of the internal power supply circuit 7 becomes less than the voltage V1 at a time T10, the voltage V1 becomes a power supply stopping transitional period of the power conversion unit 5, and a discharge is carried out as appropriate in each circuit.

According to the first embodiment, as heretofore described, the internal power supply switch 10 is provided between the anode terminal of the direct current power supply 3 and the step-up power supply circuit 8 and failure detection unit 9, because of which dark current flowing when operation of the power conversion device 1 is stopped can be reduced.

Also, by the bias power supply switch 11 being provided in parallel with the internal power supply switch 10, and the operational order when the power supply is started up or stopped being regulated by the voltage of each unit and time in accordance with the output voltage of the internal power supply circuit 7 and the step-up power supply circuit start-up signal 7b, malfunction when the power supply is started up or stopped can be prevented. That is, when the output voltage of the internal power supply circuit 7 is less than the voltage V1, the voltage output of the step-up power supply circuit 8, which is the drive power source of the power conversion unit 5, is stopped, because of which flow-through current caused by malfunction of the control unit 6 or of the power semiconductor switching element 2 of the power conversion unit 5 in a transitional period when the power supply is started up or stopped is prevented, and destruction of a small signal circuit in the control unit 6 due to a sneak current flowing from the power conversion unit 5 can be prevented.

Second Embodiment

Figure 3:
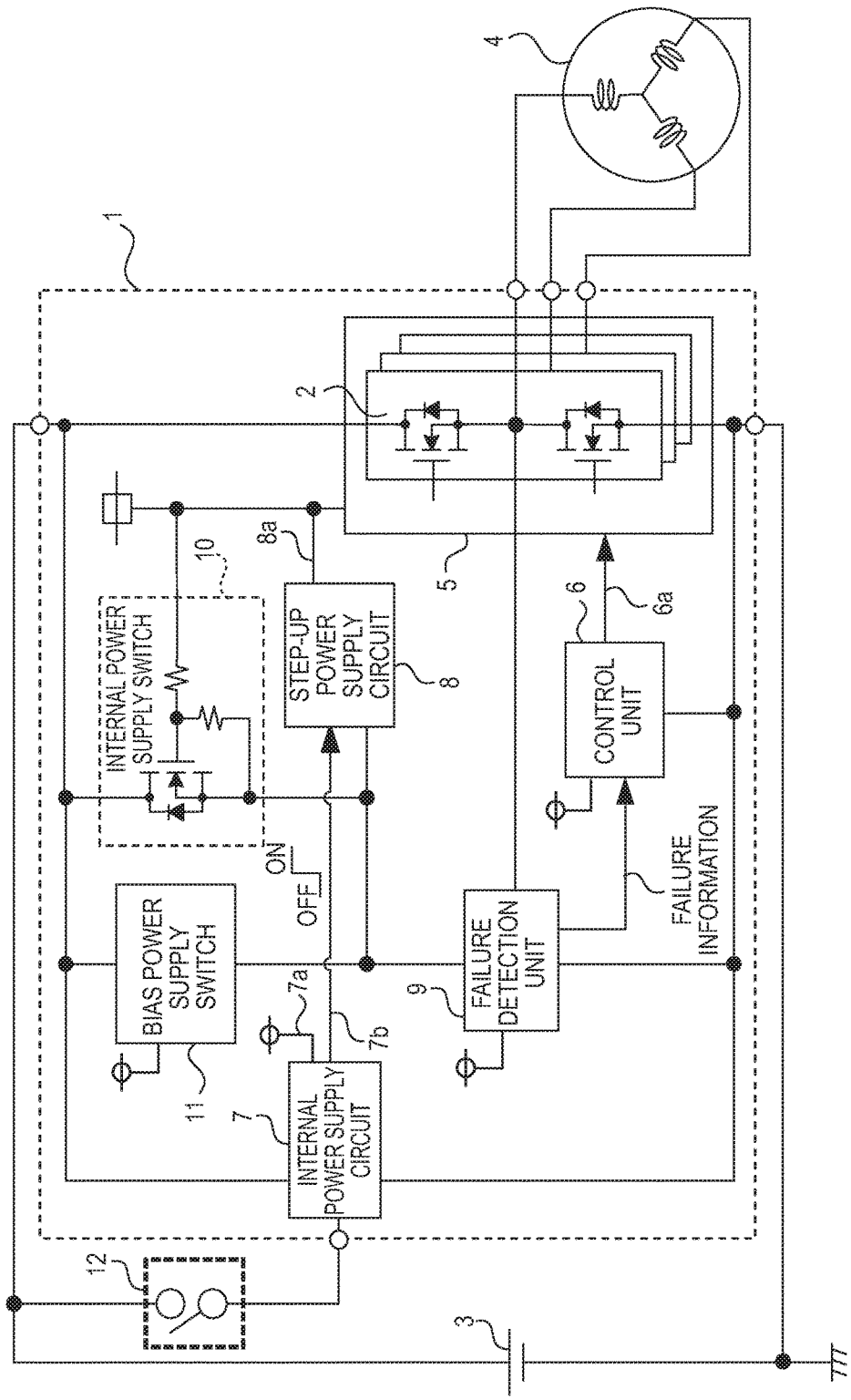
FIG. 3 is a block diagram showing a configuration of a power conversion device according to a second embodiment of the invention.

FIG. 3 shows an example wherein a failure detection unit 9 is provided in the first embodiment of the invention, and furthermore, an n-channel MOSFET is used as a specific example of the internal power supply switch 10.

The failure detection unit 9 is configured of, for example, a transistor or comparator. The failure detection unit 9 compares the voltage of the anode or cathode of the direct current power supply 3 and a phase voltage of the multi-phase rotating electrical machine 4, and detects an abnormal state of the power conversion unit 5 as a failure when the voltages are different, because of which the failure detection unit 9 is connected in a place in the power conversion device 1 where the voltages of the connection terminals of the direct current power supply 3 and of the connection terminals of the multi-phase rotating electrical machine 4 are obtained.

In the same way that the output voltage of the internal power supply circuit 7 is set to a voltage such that the control unit 6 does not malfunction in the first embodiment, it is desirable that the output voltage of the internal power supply circuit 7 is set in the region of 1.4 times to 1.7 times a voltage such that the failure detection unit 9 does not malfunction.

As the second embodiment is simply such that the internal power supply switch 10 and failure detection unit 9 are shown specifically, operations and configurations of other portions are identical to those in the first embodiment, because of which a description is omitted. However, as an n-channel MOSFET is used for the internal power supply switch 10, voltage drop caused by the internal power supply switch 10 can be reduced, and the effect on the voltage detection accuracy of the failure detection unit 9 can be reduced. In addition, by an n-channel MOSFET being used for the internal power supply switch 10, the on-state resistance of the internal power supply switch 10 does not increase even when the anode voltage of the direct current power supply 3 fluctuates due to turn-off surge voltage of the power conversion unit 5, and an advantage can be achieved in that a voltage detection error of the failure detection unit 9 is unlikely to be caused.

Third Embodiment

Figure 4:
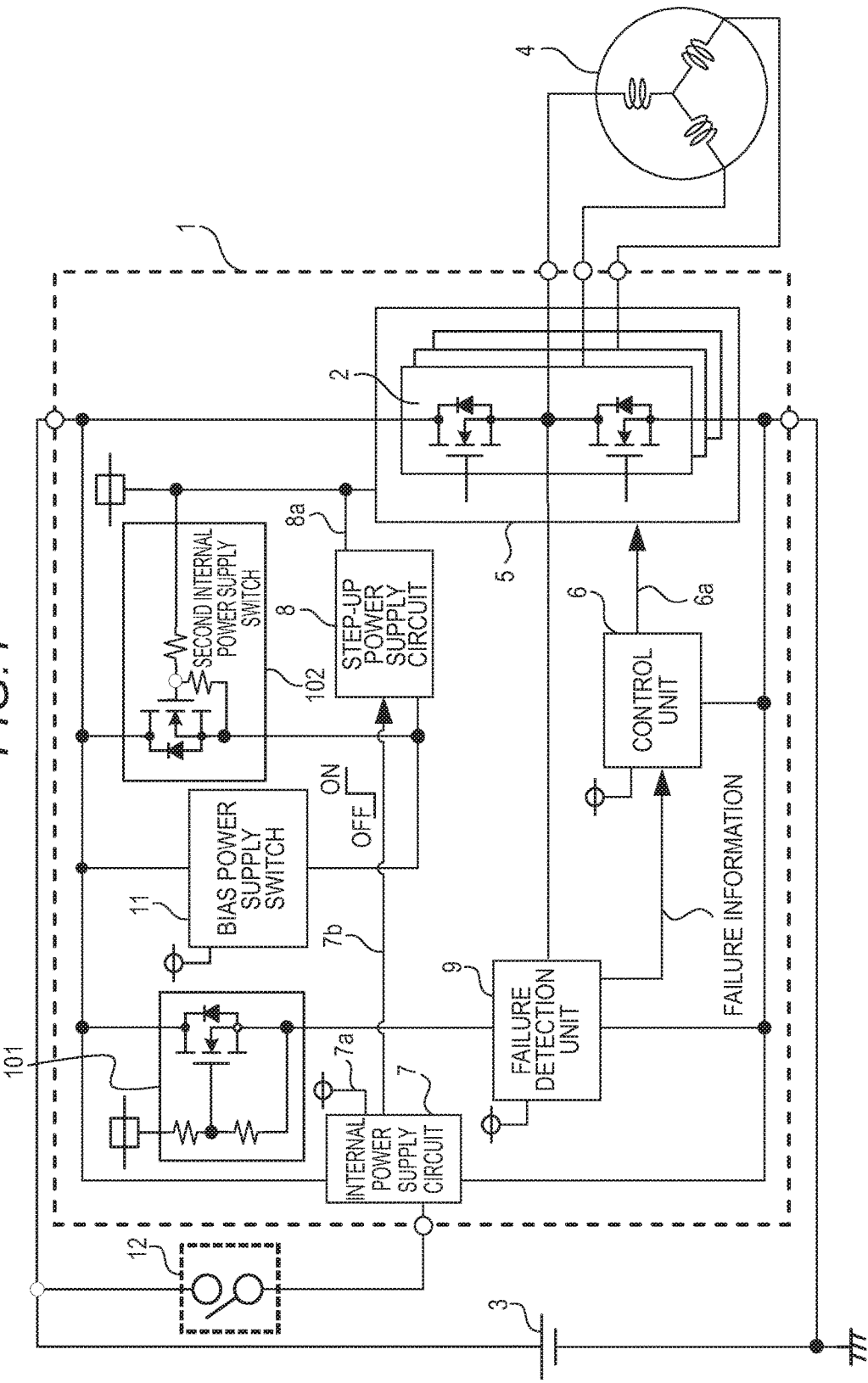
FIG. 4 is a block diagram showing a configuration of a power conversion device according to a third embodiment of the invention.

FIG. 4 shows a configuration of a power conversion device in a third embodiment of the invention. When compared with the second embodiment shown in FIG. 3, FIG. 4 differs in that the internal power supply switch 10 is divided into two, the failure detection unit 9 is connected to the anode terminal of the direct current power supply 3 via a first internal power supply switch 101, and the step-up power supply circuit 8 is connected to the anode terminal of the direct current power supply 3 via a second internal power supply switch 102 and the bias power supply switch 11. As other configurations and operations are the same as in FIG. 1, a description will be omitted here.

Figure 2:
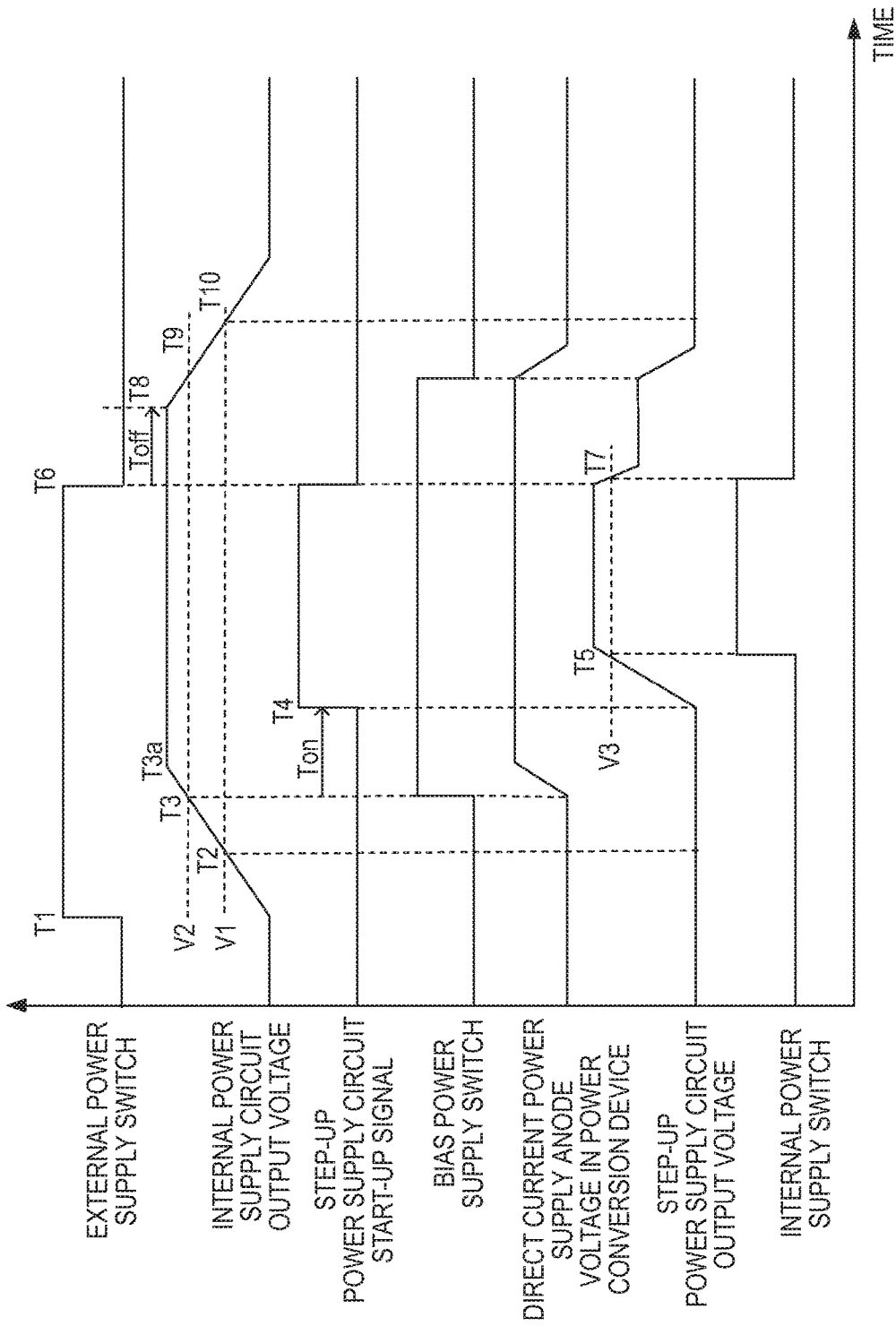
FIG. 2 is a timing chart showing voltage waveforms when a power supply of the power conversion device according to the first embodiment of the invention is started up and stopped.

Operations when the power supply of the power conversion device in this embodiment is started up and stopped are the same as in the timing chart of FIG. 2 shown in the first embodiment, because of which a description thereof will be omitted here.

The first internal power supply switch 101 and second internal power supply switch 102 are configured of an n-channel MOSFET, in the same way as the internal power supply switch 10, and open or close a current path based on the output voltage of the step-up power supply circuit 8.

According to the third embodiment, as heretofore described, the first internal power supply switch 101 is provided between the anode terminal of the direct current power supply 3 and the failure detection unit 9, and the second internal power supply switch 102 is provided between the anode terminal of the direct current power supply 3 and the step-up power supply circuit 8, because of which dark current flowing when operation of the power conversion device 1 is stopped can be reduced, in the same way as in the first embodiment.

Also, by the bias power supply switch 11 being provided in parallel with the second internal power supply switch 102, and the operational order when the power supply is started up or stopped being regulated by the voltage of each unit and time in accordance with the output voltage of the internal power supply circuit 7 and the step-up power supply circuit start-up signal 7b, malfunction when the power supply is started up or stopped can be prevented. That is, when the output voltage of the internal power supply circuit 7 is less than the voltage V1, the voltage output of the step-up power supply circuit 8, which is the drive power source of the power conversion unit 5, is stopped, because of which flow-through current caused by malfunction of the control unit 6 or of the power semiconductor switching element 2 of the power conversion unit 5 in a transitional period when the power supply is started up or stopped is prevented, and destruction of a small signal circuit in the control unit 6 due to a sneak current flowing from the power conversion unit 5 can be prevented.

Furthermore, as the internal power supply switch 10 is divided into two, and an n-channel MOSFET is used for the first internal power supply switch 101, there is no current consumption accompanying a step-up operation of the step-up power supply circuit 8 in the first internal power supply switch 101, voltage drop in the first internal power supply switch 101 can be further reduced, and the effect on the voltage detection accuracy of the failure detection unit 9 can be minimized.

In addition, the on-state resistance of the first internal power supply switch 101 does not increase even when the anode voltage of the direct current power supply 3 fluctuates due to turn-off surge voltage of the power conversion unit 5, and there is an advantage in that a voltage detection error of the failure detection unit 9 is unlikely to be caused.

Fourth Embodiment

Figure 5:
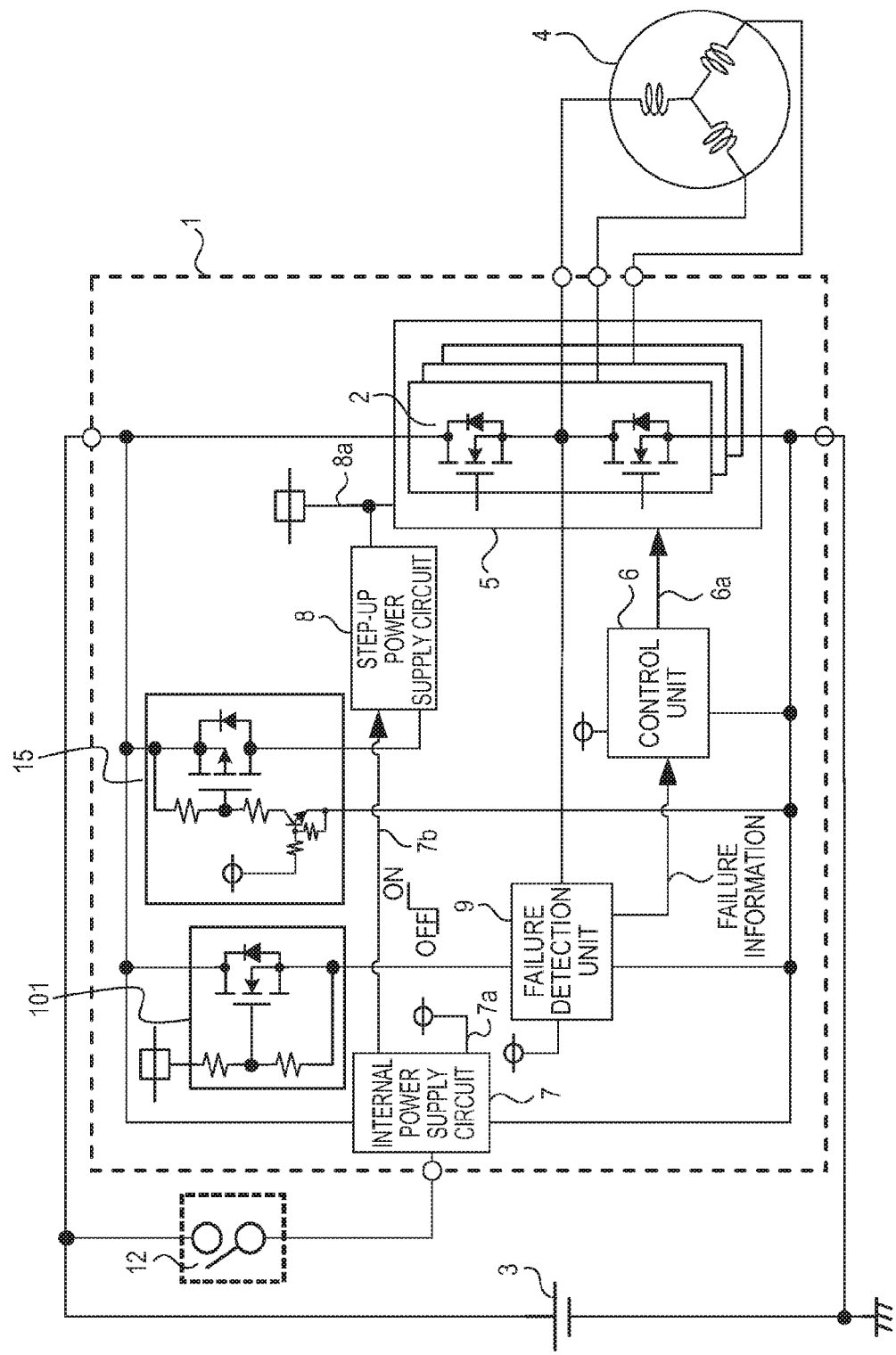
FIG. 5 is a block diagram showing a configuration of a power conversion device according to a fourth embodiment of the invention.

FIG. 5 shows a configuration of a power conversion device in a fourth embodiment of the invention. When compared with the third embodiment shown in FIG. 4, FIG. 5 differs in that the bias power supply switch 11 is omitted, and a p-channel MOSFET is used for a second internal power supply switch 15. As other configurations and operations are the same as in FIG. 1, a description will be omitted here.

Operations when the power supply of the power conversion device in this embodiment is started up and stopped are the same as in the timing chart of FIG. 2 shown in the first embodiment, excepting that the operation of the bias power supply switch 11 is replaced by an operation of the second internal power supply switch 15, because of which a description thereof will be omitted here.

The second internal power supply switch 15 is configured of a p-channel MOSFET, and opens or closes a current path based on the output voltage of the step-up power supply circuit 8.

According to the fourth embodiment, as heretofore described, the first internal power supply switch 101 is provided between the anode terminal of the direct current power supply 3 and the failure detection unit 9, and the second internal power supply switch 15 is provided between the anode terminal of the direct current power supply 3 and the step-up power supply circuit 8, because of which dark current flowing when operation of the power conversion device 1 is stopped can be reduced.

Also, by the operational order when the power supply is started up or stopped being regulated by the voltage of each unit and time in accordance with the output voltage of the internal power supply circuit 7 and the step-up power supply circuit start-up signal 7*b*, malfunction when the power supply is started up or stopped can be prevented. That is, when the output voltage of the internal power supply circuit 7 is less than the voltage V1, the voltage output of the step-up power supply circuit 8, which is the drive power source of the power conversion unit 5, is stopped, because of which flow-through current caused by malfunction of the control unit 6 or of the power semiconductor switching element 2 of the power conversion unit 5 in a transitional period when the power supply is started up or stopped is prevented, and destruction of a small signal circuit in the control unit 6 due to a sneak current flowing from the power conversion unit 5 can be prevented.

Furthermore, as the internal power supply switch 10 is divided into two, and an n-channel MOSFET is used for the first internal power supply switch 101, there is no current consumption accompanying a step-up operation of the step-up power supply circuit 8 in the first internal power supply switch 101, voltage drop in the first internal power supply switch 101 can be further reduced, and the effect on the voltage detection accuracy of the failure detection unit 9 can be minimized.

In addition, the on-state resistance of the first internal power supply switch 101 does not increase even when the anode voltage of the direct current power supply 3 fluctuates due to turn-off surge voltage of the power conversion unit 5, and there is an advantage in that a voltage detection error of the failure detection unit 9 is unlikely to be caused.

Also, as a p-channel MOSFET is used for the second internal power supply switch 15, circuit configuration is simple, the power conversion device 1 can be reduced in size, and costs can be reduced.

Fifth Embodiment

In the embodiments to date, the operational order when the power supply is started up or stopped is regulated by the voltage of each unit and time in accordance with the output voltage of the internal power supply circuit 7 and the step-up power supply circuit start-up signal 7*b* but, the invention not being limited to this, the power supply start-up and stopping operations may be regulated by, for example, the microcomputer configuring the control unit 6 or by an ASIC. Hereafter, a detailed description of a configuration and operation thereof will be given in a fifth embodiment of the invention.

Figure 6:
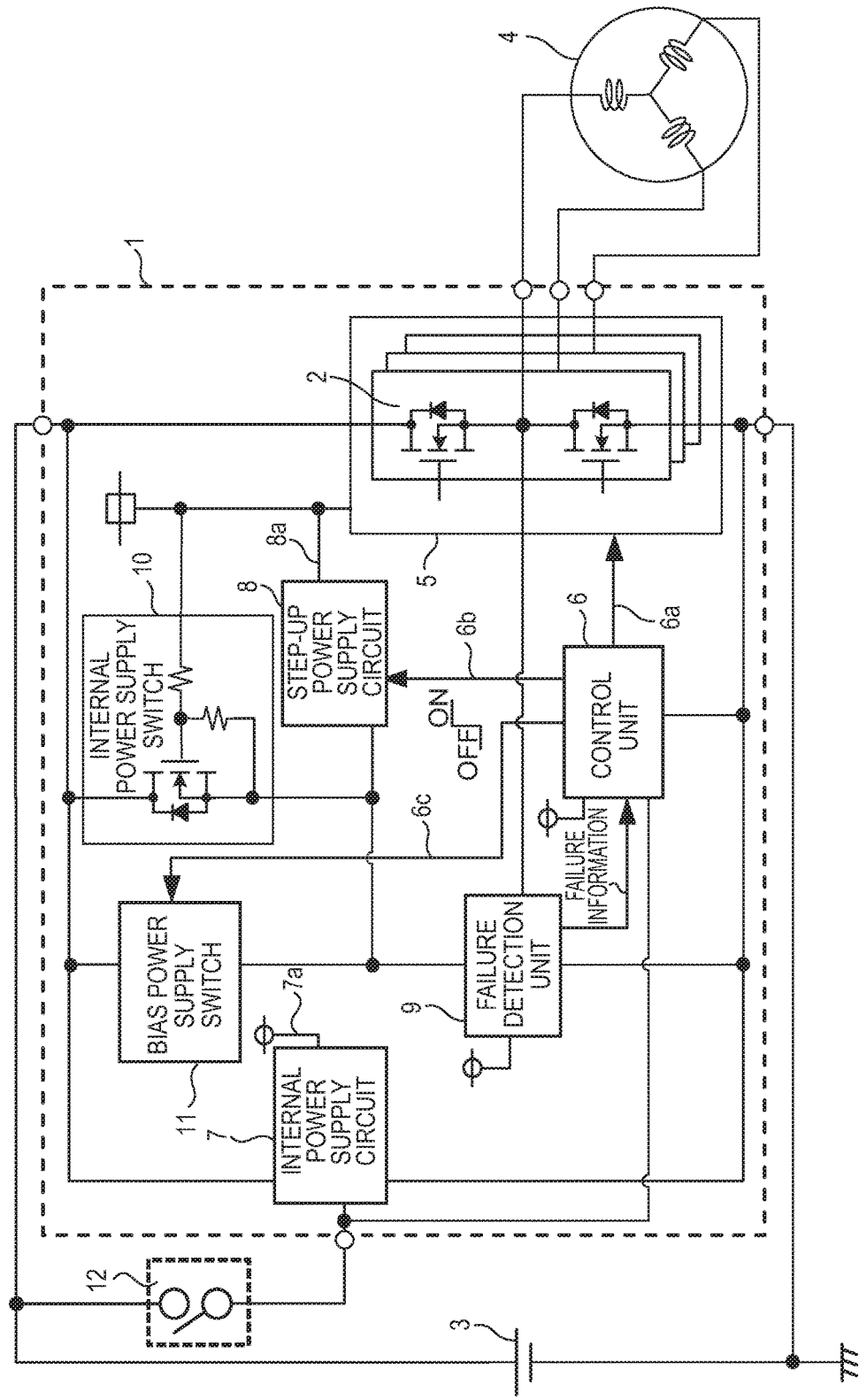
FIG. 6 is a block diagram showing a configuration of a power conversion device according to a fifth embodiment of the invention.

FIG. 6 shows a configuration of a power conversion device in the fifth embodiment of the invention. When compared with the first embodiment shown in FIG. 1, FIG. 6 differs in that the control unit 6 is directly connected to the external power supply switch 12 and detects an activating or deactivating of the external power supply switch 12, a step-up power supply circuit start-up signal 6*b* is output from the control unit 6, and the bias power supply switch 11 opens or closes a current circuit based on a bias power supply switch drive signal 6*c* output from the control unit 6. As other configurations and operations are the same as in FIG. 1, a description will be omitted here.

Hereafter, operations when the power conversion device 1 power supply is started up and stopped will be described using a timing chart of FIG. 7, and an operation sequence of the control unit 6 will be described using a flowchart of FIG. 8.

Figure 7:
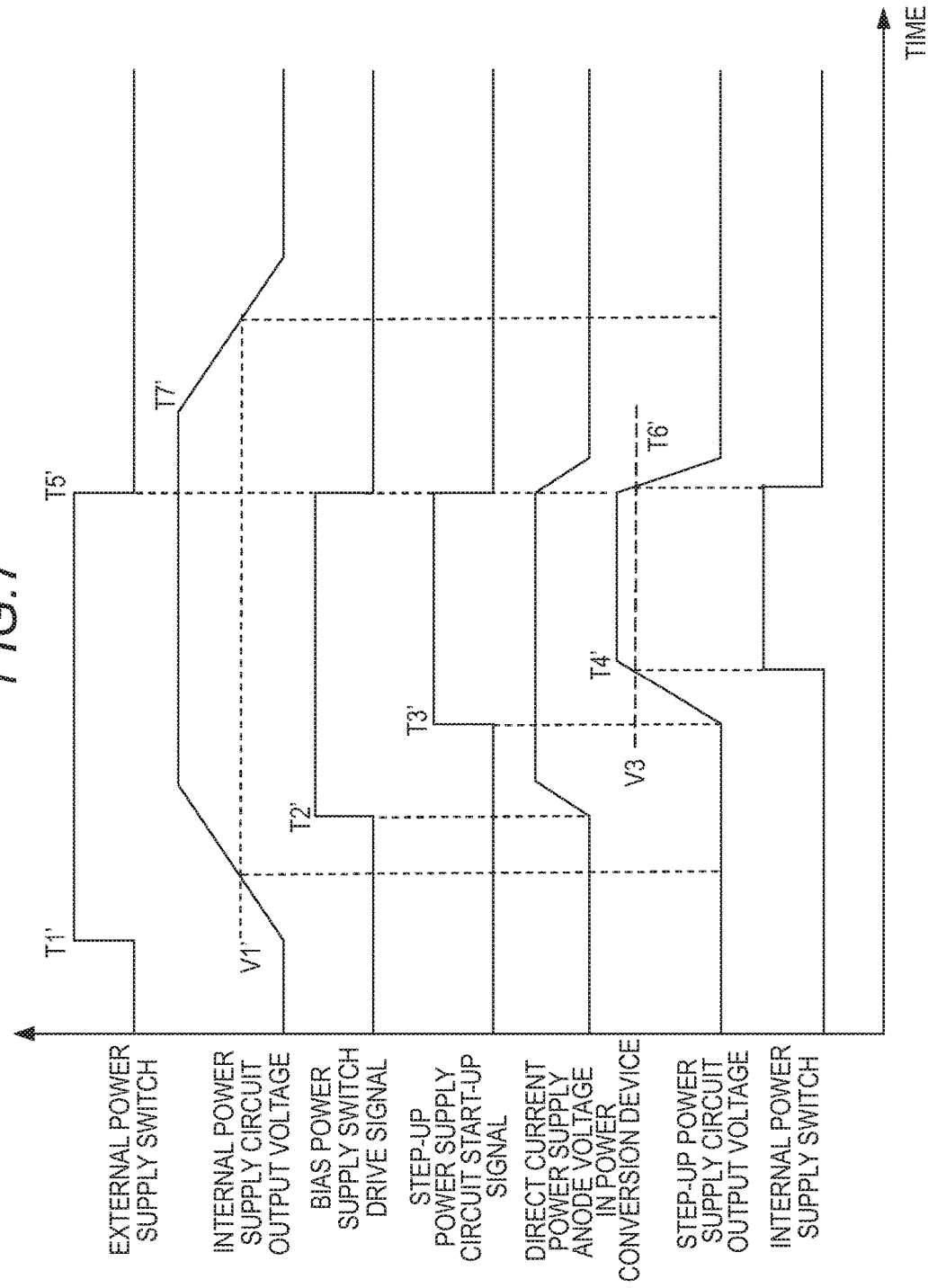
FIG. 7 is a timing chart showing voltage waveforms when a power supply of the power conversion device according to the fifth embodiment of the invention is started up and stopped.

When the power conversion device 1 power supply is started up, the external power supply switch 12 is activated at a time T1' of FIG. 7, and the internal power supply circuit 7 starts a voltage output. Then, the control unit 6 starts operating, detects that the external power supply switch 12 is activated, and starts a process of FIG. 8.

Figure 8:
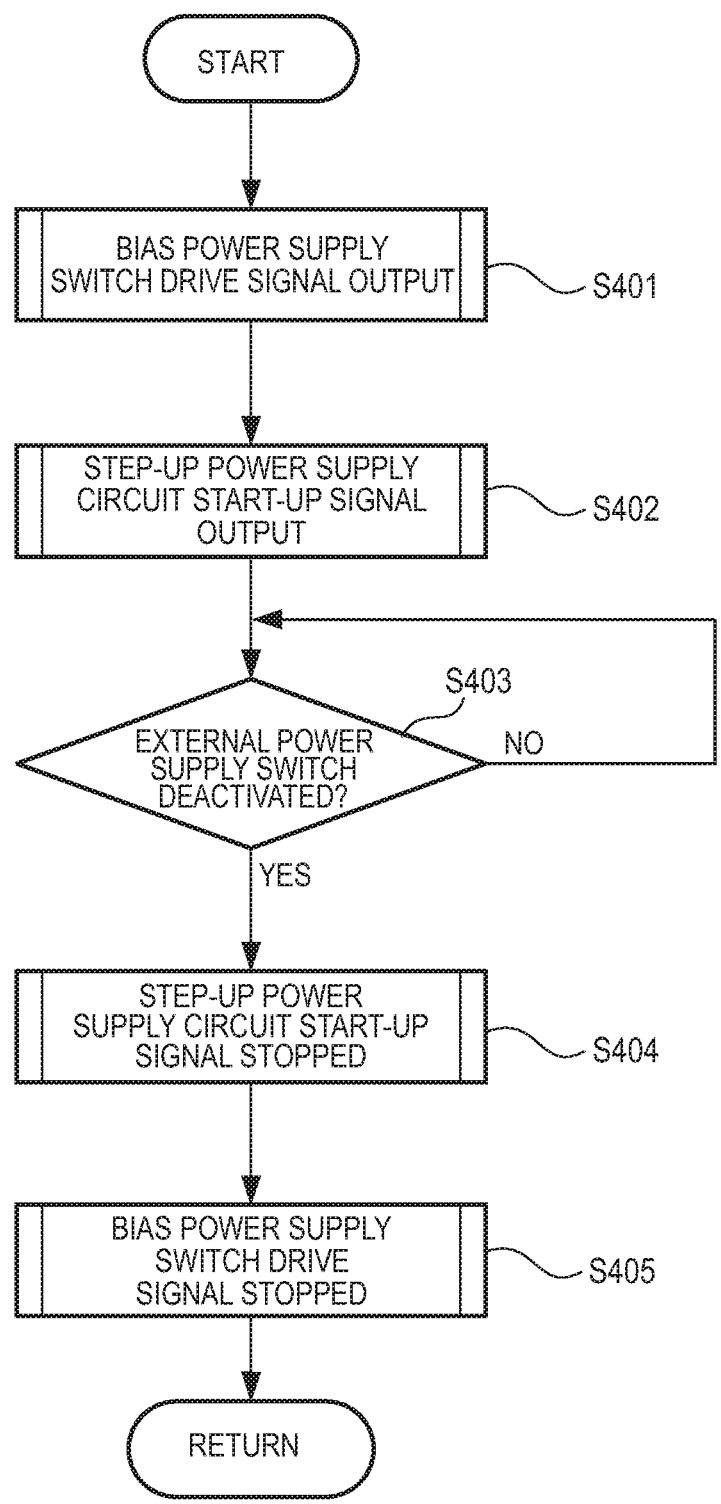
FIG. 8 is a flowchart illustrating an operation of a control unit in the power conversion device according to the fifth embodiment of the invention.

In FIG. 8, firstly, the control unit 6 outputs the bias power supply switch drive signal 6*c* in step S401 (a time T2' in the time chart of FIG. 7). Then, the process proceeds to step S402, the control unit 6 outputs the step-up power supply circuit start-up signal 6*b* at a time T3' of FIG. 7, and the process proceeds to step S403. As a method of setting the waiting time from the time T2' to the time T3' of FIG. 7, for example, a method whereby the waiting time is the time until the bias power supply switch 11 is activated and the anode voltage of the direct current power supply 3 applied to the interior of the power conversion device stabilizes, or a method whereby the waiting time is the delay time until the bias power supply switch drive signal 6*c* reaches the bias power supply switch 11, may be proposed. Alternatively, a method whereby a circuit that detects the anode voltage of the direct current power supply 3 applied to the interior of the power conversion device is newly provided, and the step-up power supply circuit start-up signal 6*b* is output based on a voltage value detected in the circuit, may be employed.

Subsequently, when the output voltage of the step-up power supply circuit 8 reaches the voltage V3 at a time T4' of FIG. 7, the internal power supply switch 10 is activated, whereby the power supply start-up process is completed.

Meanwhile, when the external power supply switch 12 is deactivated when the state of the external power supply switch 12 is detected in step S403 of FIG. 8, the process proceeds to step S404, and a power supply stopping process is implemented. If the external power supply switch 12 is not deactivated, a routine process whereby the state of the external power supply switch 12 is monitored again is implemented.

In step S404, the step-up power supply circuit start-up signal 6*b* is stopped, and the process proceeds to step S405. In step S405, the bias power supply switch drive signal 6*c* is stopped (a time T5' in the time chart of FIG. 7).

Subsequently, when the output voltage of the step-up power supply circuit 8 becomes less than the voltage V3 at a time T6' of FIG. 7, the internal power supply switch 10 is deactivated, and furthermore, the internal power supply circuit 7 stops the voltage output at a time T7', after which discharge is carried out as appropriate in each circuit. As a method of setting the waiting time from the time T5' to the time T7' of FIG. 7, for example, a method whereby the waiting time is the time until the output voltage of the step-up power supply circuit 8 returns to zero, or a method whereby the waiting time is the time needed for a process of stopping the power supply to the microcomputer configuring the control unit 6, may be proposed. Alternatively, a method whereby a circuit that detects the anode voltage of the direct current power supply 3 applied to the interior of the power conversion device is newly provided, and the voltage output of the internal power supply circuit 7 is stopped based on a voltage value detected in the circuit, may be employed.

According to the fifth embodiment, as heretofore described, the internal power supply switch 10 is provided between the anode terminal of the direct current power supply 3 and the step-up power supply circuit 8 and failure detection unit 9, because of which dark current flowing when operation of the power conversion device 1 is stopped can be reduced.

Also, by the bias power supply switch 11 being provided in parallel with the internal power supply switch 10, and the operational order when the power supply is started up or stopped being regulated by time or by the voltage of each unit in accordance with the bias power supply switch drive signal 6c and step-up power supply circuit start-up signal 6b output from the control unit 6, malfunction when the power supply is started up or stopped can be prevented. That is, when the output voltage of the internal power supply circuit 7 is less than the voltage V1, the voltage output of the step-up power supply circuit 8, which is the drive power source of the power conversion unit 5, is stopped, because of which flow-through current caused by malfunction of the control unit 6 or of the power semiconductor switching element 2 of the power conversion unit 5 in a transitional period when the power supply is started up or stopped is prevented, and destruction of a small signal circuit in the control unit 6 due to a sneak current flowing from the power conversion unit 5 can be prevented.

Furthermore, voltage output of the step-up power supply circuit 8 is permitted in the control unit 6, the state of the external power supply switch 12 is also monitored in the control unit 6, deactivating of the external power supply switch 12 is detected, and the step-up power supply circuit start-up signal 6b and bias power supply switch drive signal 6c are stopped, because of which the voltage output of the step-up power supply circuit 8 can be stopped earlier than in the first embodiment, whereby the effect of variation in the time taken for the power supply to start up or stop is reduced, and malfunction when the power supply is stopped can be more reliably prevented.

In addition, as an n-channel MOSFET is used for the internal power supply switch 10, voltage drop caused by the internal power supply switch 10 can be reduced, and the effect on the voltage detection accuracy of the failure detection unit 9 can be reduced.

Also, as an n-channel MOSFET is used for the internal power supply switch 10, the on-state resistance of the internal power supply switch 10 does not increase even when the anode voltage of the direct current power supply 3 fluctuates due to turn-off surge voltage of the power conversion unit 5, and there is an advantage in that a voltage detection error of the failure detection unit 9 is unlikely to be caused.

It will be apparent to those skilled in the art that various modifications and alterations of the invention can be made without departing from the scope and spirit of the invention, and it should be understood that this is not limited to the illustrative embodiments set forth herein.

Various modifications and alterations of this invention will be apparent to those skilled in the art without departing from the scope and spirit of this invention, and it should be understood that this is not limited to the illustrative embodiments set forth herein.

The invention claimed is:

1. A power conversion device, comprising:
   a power conversion unit that converts direct current power into alternating current power between a direct current power supply and a multi-phase rotating electrical machine;
   a control unit that controls an operation of the power conversion unit;
   a step-up power supply circuit connected to the power conversion unit and supplying an operation power supply to the power conversion unit;
   an internal power supply circuit, connected to an anode terminal of the direct current power supply via an external power supply switch, that outputs a predetermined voltage based on a state of the external power supply switch and outputs a step-up power supply circuit start-up signal to the step-up power supply circuit;
   an internal power supply switch, connected between the direct current power supply and the step-up power supply circuit, that opens or closes a current path from the direct current power supply to the step-up power supply circuit based on an output voltage of the step-up power supply circuit; and
   a bias power supply switch, connected in parallel with the internal power supply switch, that opens or closes a current path from the direct current power supply to the step-up power supply circuit based on an output voltage of the internal power supply circuit, wherein
   when the output voltage of the internal power supply circuit is equal to or greater than a predetermined value at a time of a start-up by the external power supply switch, the bias power supply switch opens a current path, the step-up power supply circuit steps up and outputs a predetermined voltage based on the step-up power supply circuit start-up signal, and the internal power supply switch opens a current path, when the output voltage of the internal power supply circuit is equal to or lower than a predetermined value at a time of a stop by the external power supply switch, the step-up operation of the step-up power supply circuit is stopped in response to a stopping of the step-up power supply circuit start-up signal and the internal power supply switch closes the current path, and when the output voltage of the internal power supply circuit becomes lower than a predetermined value, the bias power supply switch closes the current path.

2. The power conversion device according to claim 1, wherein
   the internal power supply switch is configured of an n-channel MOSFET.

3. The power conversion device according to claim 1, further comprising:
   a failure detection unit, connected between a connection terminal of the direct current power supply and a connection terminal of the multi-phase rotating electrical machine, that compares an anode voltage or cathode voltage of the direct current power supply and a phase voltage of the multi-phase rotating electrical machine, thereby detecting a failure of the power conversion unit.

4. The power conversion device according to claim 3, wherein
the internal power supply switch is configured of a first internal power supply switch, connected between the anode terminal of the direct current power supply and the failure detection unit, that opens or closes a current path from the anode terminal of the direct current power supply to the failure detection unit based on the output voltage of the step-up power supply circuit, and a second internal power supply switch, connected between the anode terminal of the direct current power supply and the step-up power supply circuit, that opens or closes a current path from the anode terminal of the direct current power supply to the step-up power supply circuit based on the output voltage of the step-up power supply circuit, wherein the bias power supply switch is connected in parallel with the second internal power supply switch, and opens or closes a current path from the anode terminal of the direct current power supply to the step-up power supply circuit 8 based on the output voltage of the internal power supply circuit.

5. The power conversion device according to claim 4, wherein
the first internal power supply switch and second internal power supply switch are configured of an n-channel MOSFET.

6. The power conversion device according to claim 4, wherein
the first internal power supply switch is configured of an n-channel MOSFET and the second internal power supply switch is configured of a p-channel MOSFET, and wherein, when the output voltage of the internal power supply circuit is equal to or greater than a predetermined value at the start-up time, the second internal power supply switch opens a current path, the step-up power supply circuit steps up and outputs a predetermined voltage based on the step-up power supply circuit start-up signal, and the first internal power supply switch opens a current path, the step-up operation of the step-up power supply circuit is stopped in response to a stopping of the step-up power supply circuit start-up signal and the first internal power supply switch closes the current path at the stop time, and when the output voltage of the internal power supply circuit becomes lower than a predetermined value, the second internal power supply switch closes the current path.

7. The power conversion device according to claim 2, wherein
the control unit controls a power conversion operation of the power conversion unit, carries out an output of the step-up power supply circuit start-up signal of the internal power supply circuit, and outputs a power supply switch drive signal to the bias power supply switch, the bias power supply switch opens a current channel in response to an output of the power supply switch drive signal, the step-up power supply circuit steps up and outputs a predetermined voltage based on the step-up power supply circuit start-up signal, and the internal power supply switch opens a current path at a start-up time, and at a stop time, the step-up operation of the step-up power supply circuit is stopped in response to a stopping of the step-up power supply circuit start-up signal, the internal power supply switch closes the current path, and the bias power supply switch closes the current path in response to a stopping of the power supply switch drive signal.

* * * * *